(12) United States Patent
Chang et al.

(10) Patent No.: US 11,148,939 B2
(45) Date of Patent: Oct. 19, 2021

(54) STRESS COMPENSATION FOR PIEZOELECTRIC OPTICAL MEMS DEVICES

(71) Applicant: Texas Instruments Incorporated, Dallas, TX (US)

(72) Inventors: YungShan Chang, Plano, TX (US); Ricky A. Jackson, Richardson, TX (US); Jeff W. Ritchison, Plano, TX (US); Neng Jiang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 152 days.

(21) Appl. No.: 15/890,781

(22) Filed: Feb. 7, 2018

(65) Prior Publication Data
US 2018/0179054 A1    Jun. 28, 2018

Related U.S. Application Data

(63) Continuation of application No. 14/533,947, filed on Nov. 5, 2014, now Pat. No. 9,890,040.

(60) Provisional application No. 62/018,798, filed on Jun. 30, 2014.

(51) Int. Cl.
| | |
|---|---|
| *G02B 26/06* | (2006.01) |
| *G02B 13/14* | (2006.01) |
| *B81C 1/00* | (2006.01) |
| *B81B 7/02* | (2006.01) |
| *B81B 3/00* | (2006.01) |

(52) U.S. Cl.
CPC ........ *B81C 1/00523* (2013.01); *B81B 3/0072* (2013.01); *B81B 7/02* (2013.01); *G02B 13/14* (2013.01); *G02B 26/06* (2013.01); *B81B 3/0021* (2013.01); *B81B 2201/047* (2013.01); *B81C 1/00349* (2013.01); *B81C 2201/0174* (2013.01)

(58) Field of Classification Search
CPC ....... G02F 1/29; G02F 2001/294; G02B 3/14; G02B 3/12; G02B 26/00; G02B 26/06; G02B 26/08; G02B 26/0808–0833; G02B 26/0857; G02B 26/0875–0883; B81B 7/02; B81B 3/0021; B81B 3/0072; B81C 1/00523; B81C 1/00531
See application file for complete search history.

(56) References Cited

U.S. PATENT DOCUMENTS

| | | |
|---|---|---|
| 8,279,541 B2 | 10/2012 | Henderson et al. |
| 2008/0225379 A1 | 9/2008 | Mescher |
| 2010/0208357 A1 | 8/2010 | Batchko et al. |
| 2012/0063000 A1 | 3/2012 | Batchko et al. |
| 2012/0170134 A1 | 7/2012 | Bolis et al. |
| 2012/0170920 A1 | 7/2012 | Moreau et al. |

*Primary Examiner* — Marin Pichler
(74) *Attorney, Agent, or Firm* — Andrew R. Ralston; Charles A. Brill; Frank D. Cimino

(57) ABSTRACT

An apparatus includes a lens material forming a lens. The apparatus also includes a piezoelectric capacitor over the lens material, where the piezoelectric capacitor is configured to change a shape of the lens material in response to a voltage across the piezoelectric capacitor to thereby change a focus of the lens. The apparatus further includes at least one stress compensation ring over a portion of the lens material and over at least a portion of the piezoelectric capacitor. The at least one stress compensation ring is configured to at least partially reduce bending of the lens material caused by stress on or in the lens material.

18 Claims, 4 Drawing Sheets

STRESS COMPENSATION FOR PIEZOELECTRIC OPTICAL MEMS DEVICES

CROSS-REFERENCE TO RELATED APPLICATION AND PRIORITY CLAIM

This application is a continuation of and claims priority to U.S. patent application Ser. No. 14/533,947 filed on Nov. 5, 2014, which claims priority under 35 U.S.C. § 119(e) to U.S. Provisional Patent Application No. 62/018,798 filed on Jun. 30, 2014, all of which are hereby incorporated by reference in their entireties.

TECHNICAL FIELD

This disclosure is generally directed to optical devices. More specifically, this disclosure is directed to stress compensation for piezoelectric optical micro-electromechanical system (MEMS) devices.

BACKGROUND

A piezoelectric material represents a material that generates a voltage when the material changes shape or that changes shape when a voltage is applied to the material. Piezoelectric materials have been used in a wide variety of devices, such as lens actuators. Often times, lens actuators use a piezoelectric material to push or pull a lens in order to cause linear movement of the lens back and forth over a small distance, which changes the focusing of light by the lens.

SUMMARY

This disclosure provides stress compensation for piezoelectric optical micro-electromechanical system (MEMS) devices.

In a first embodiment, an apparatus includes a lens material forming a lens. The apparatus also includes a piezoelectric capacitor over the lens material, where the piezoelectric capacitor is configured to change a shape of the lens material in response to a voltage across the piezoelectric capacitor to thereby change a focus of the lens. The apparatus further includes at least one stress compensation ring over a portion of the lens material and over at least a portion of the piezoelectric capacitor. The at least one stress compensation ring is configured to at least partially reduce bending of the lens material caused by stress on or in the lens material.

In a second embodiment, a system includes an auto-focus lens having a lens material forming a lens. The system also includes a driver configured to change a shape of the lens material in order to change a focus of the lens. The auto-focus lens also comprises a piezoelectric capacitor over the lens material, where the piezoelectric capacitor is configured to change the shape of the lens material in response to a voltage across the piezoelectric capacitor. The auto-focus lens further includes at least one stress compensation ring over a portion of the lens material and over at least a portion of the piezoelectric capacitor. The at least one stress compensation ring is configured to at least partially reduce bending of the lens material caused by stress on or in the lens material.

In a third embodiment, a method includes depositing a lens material forming a lens. The method also includes forming a piezoelectric capacitor over the lens material, where the piezoelectric capacitor is configured to change a shape of the lens material in response to a voltage across the piezoelectric capacitor to thereby change a focus of the lens. The method further includes forming at least one stress compensation ring over a portion of the lens material and over at least a portion of the piezoelectric capacitor. The at least one stress compensation ring is configured to at least partially reduce bending of the lens material caused by stress on or in the lens material.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1A through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1A:
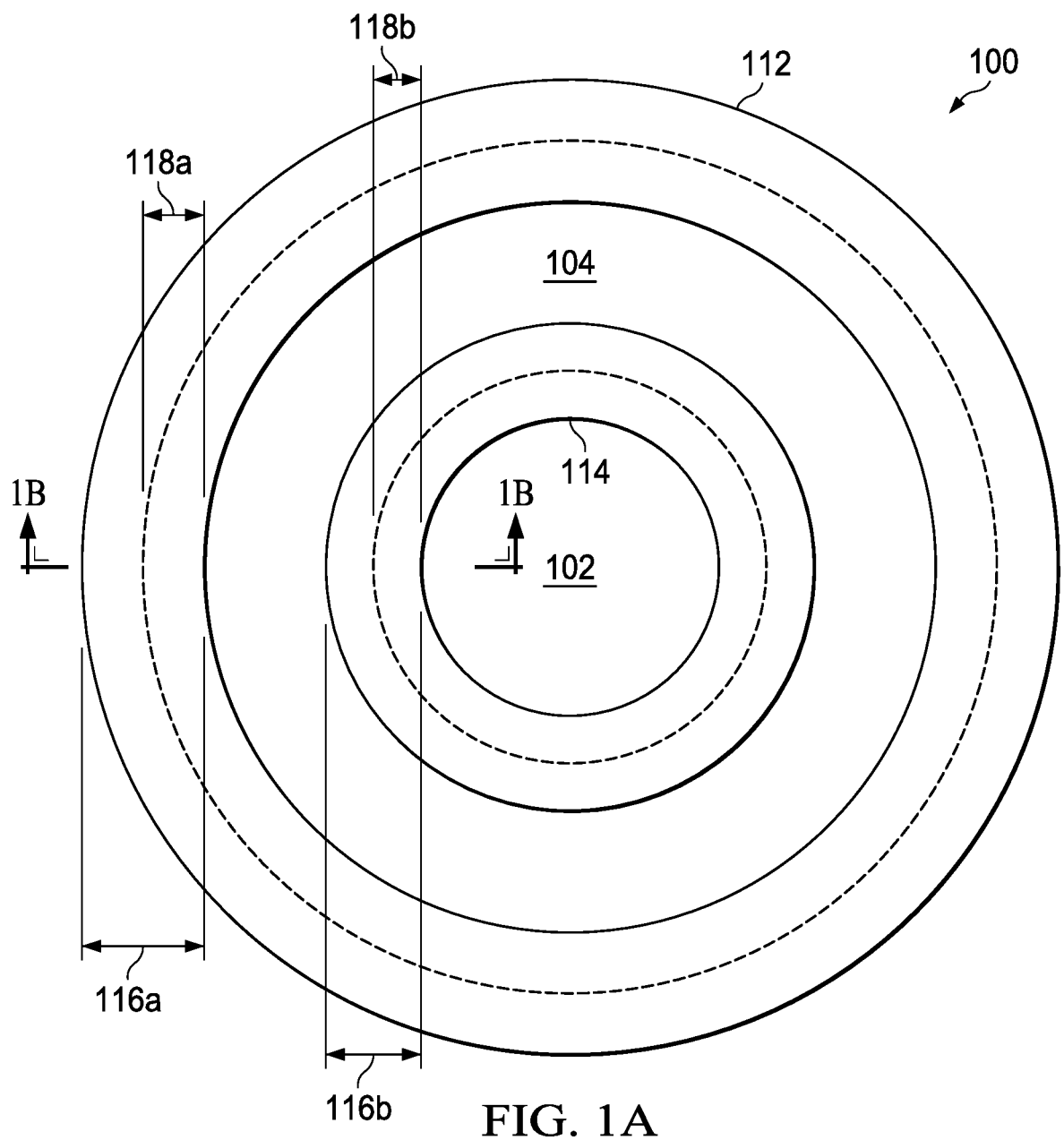
FIGS. 1A and 1B illustrate an example piezoelectric optical micro-electromechanical system (MEMS) device with stress compensation in accordance with this disclosure.
Figure 1B:
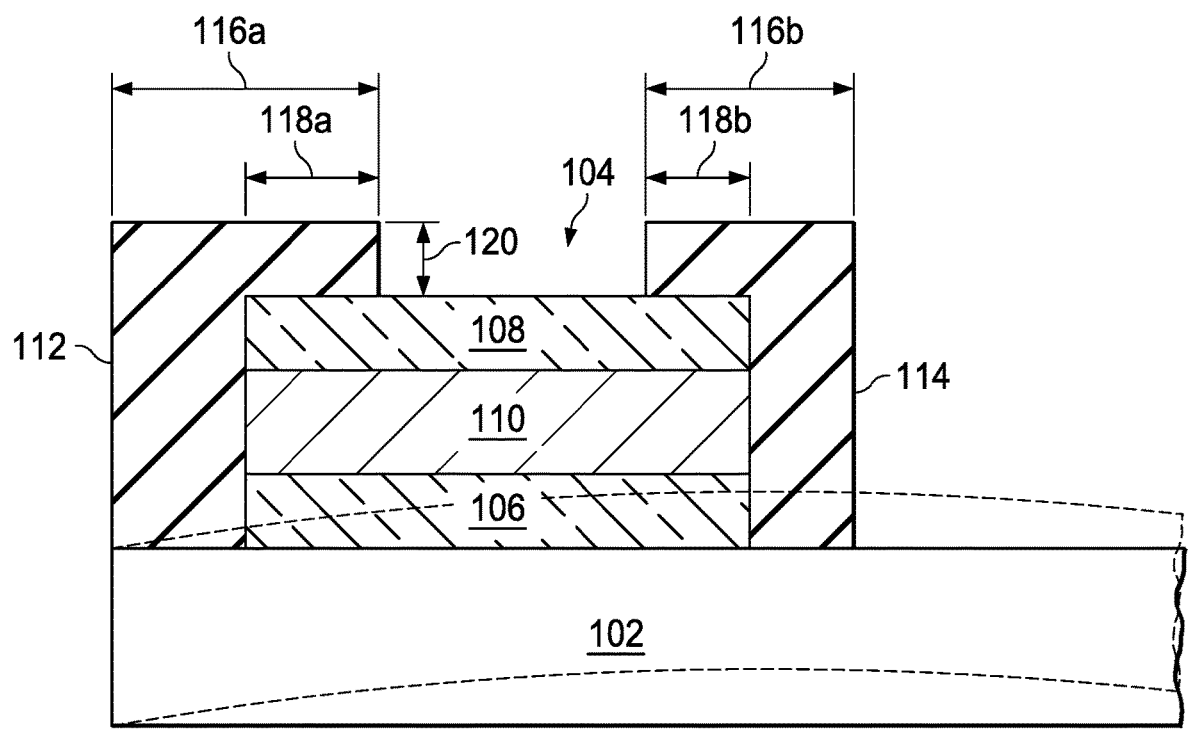

FIGS. 1A and 1B illustrate an example piezoelectric optical micro-electromechanical system (MEMS) device 100 with stress compensation in accordance with this disclosure. In particular, FIGS. 1A and 1B illustrate an example auto-focus lens with stress compensation. FIG. 1A shows a top view of the piezoelectric optical MEMS device 100, and FIG. 1B shows a cross-section of the piezoelectric optical MEMS device 100 taken along the line shown in FIG. 1A.

As shown in FIGS. 1A and 1B, the piezoelectric optical MEMS device 100 includes lens material 102 and a piezoelectric capacitor 104. The lens material 102 generally represents any suitable material or combination of materials that is partially or fully transparent to one or more wavelengths of interest. For example, the lens material 102 could represent glass, such as borophosphosilicate glass (BPSG). The lens material 102 forms a lens and can be deformed to change the focus of the lens. The lens material 102 could include any suitable material(s) and can be formed in any suitable manner, such as via deposition on a silicon or other underlying substrate (at least part of which is later removed).

The piezoelectric capacitor 104 includes a bottom electrode 106, a top electrode 108, and a piezoelectric layer 110. Each electrode 106-108 represents a conductive structure that can be electrically coupled to an external driver or other component(s). Each electrode 106-108 can be formed from any suitable conductive material(s), such as platinum, nickel, palladium, or other metal(s). Each electrode 106-108 could also be formed in any suitable manner, such as via metal deposition followed by an etch process. In addition, each electrode 106-108 could have any suitable size, shape, and dimensions.

The electrodes 106-108 are separated by the piezoelectric layer 110 (which is also insulative) to thereby form a capacitor. A voltage applied across the electrodes 106-108 causes the piezoelectric layer 110 to bend, which causes the lens material 102 to bend and change the focus of the lens formed by the lens material 102. The piezoelectric layer 110 includes any suitable piezoelectric material(s), such as lead zirconium titanate (PZT).

One problem with this type of optical MEMS device is that stresses on or in the lens material 102 can cause the lens material 102 to bend upward. An example of this can be seen in FIG. 1B, where the dashed lines illustrate the lens material 102 bending upwards. The stresses could include, for example, compression stresses from the piezoelectric capacitor 104 or stresses in the lens material 102 itself. This bending creates an initial optical offset in the lens formed by the lens material 102. If the piezoelectric capacitor 104 can only cause the lens material 102 to bend upwards and not downwards, there is no way for this offset to be corrected. As a result, this limits how far the lens material 102 can be moved and degrades the overall operation of the optical MEMS device.

In accordance with this disclosure, one or more stress compensation rings 112-114 are formed over the lens material 102 and partially around the piezoelectric capacitor 104. In this particular example, the stress compensation ring 112 is formed along an outer perimeter of the piezoelectric capacitor 104, while the stress compensation ring 114 is formed along an inner opening or aperture of the piezoelectric capacitor 104. The stress compensation rings 112-114 reduce or substantially cancel the stresses on or in the lens material 102, such as the compression stresses from the piezoelectric capacitor 104. As a result, the lens material 102 could have a flatter shape as shown in FIG. 1B or even a shape that bends downward when no voltage is applied across the piezoelectric capacitor 104. This enables the lens material 102 to move upward more in response to the application of a voltage across the piezoelectric capacitor 104, increasing the range of the lens' focus.

Each stress compensation ring 112-114 can be formed from any suitable stress compensation material(s) and in any suitable manner. For example, each stress compensation ring 112-114 could be formed from one or more oxides, silicon nitride (SiN), titanium nitride (TiN), or a combination of one or more oxides and silicon nitride or titanium nitride. Each stress compensation ring 112-114 could be formed as a single layer of stress compensation material(s), such as a single thin film. Each stress compensation ring 112-114 could also be formed using multiple layers of stress compensation material(s), such as multiple thin films (which may or may not be formed from the same material(s)). As a particular example, one or more layers of stress compensation material can be formed over the lens material 102 and the piezoelectric capacitor 104, and a lithography pattern and etch process can be performed to etch the layer(s) of stress compensation material(s) to form the stress compensation rings 112-114.

Note that the number or characteristics of the stress compensation rings can be selected to provide the desired amount of stress needed to partially or substantially counteract the stresses created on or in the lens material 102. For example, various dimensions of the stress compensation rings 112-114 can be selected to control the amount of stress compensation provided. As shown in FIGS. 1A and 1B, the dimensions of the stress compensation rings 112-114 that can be controlled include:

the total radial thicknesses 116a-116b of the stress compensation rings 112-114;
the radial thicknesses 118a-118b of the portions of the stress compensation rings 112-114 overlying the piezoelectric capacitor 104; and
the height 120 of the stress compensation rings 112-114 over the piezoelectric capacitor 104.

Any of these parameters could be controlled as needed to provide the desired stress compensation. Also note that other or additional parameters could be used to control the amount of stress compensation, such as the number of layers or the material(s) used in the layer(s) of the stress compensation rings 112-114. In addition, note that while two stress compensation rings 112-114 are shown here, any number of stress compensation rings could be used. In general, there are many degrees of freedom associated with the use of one or more stress compensation rings, which can provide higher accuracy and greater control of the stress compensation.

Although not shown here, various other structures can be fabricated as part of the piezoelectric optical MEMS device 100. For example, a seeding layer could be used to facilitate formation of the layer(s) of material(s) used to form the bottom electrode 106 on the lens material 102, helping to improve adhesion of the bottom electrode 106 to the lens material 102. As another example, a protective layer (such as an alumina layer formed using atomic layer deposition and a silicon dioxide/silicon oxinitride/silicon dioxide stack) can be formed over the lens material 102, the piezoelectric capacitor 104, and the stress compensation rings 112-114. Electrical contacts (such as those using an aluminum copper/titanium/titanium nitride stack) can be formed and electrically coupled to the electrodes 106-108 through openings in the protective layer, and bond pads can be electrically coupled to the electrical contacts. The bond pads can be used to electrically couple the piezoelectric optical MEMS device 100 to an external device or system Although FIGS. 1A and 1B illustrate one example of a piezoelectric optical MEMS device 100 with stress compensation, various changes may be made to FIGS. 1A and 1B. For example, the size, shape, dimensions, and number of each component and the arrangement of components in the piezoelectric optical MEMS device 100 are for illustration only and can vary as needed or desired. As a particular example, the electrodes 106-108 need not be circular and could have other shapes, and the electrodes 106-108 need not have the same shape or size. As a result, the stress compensation rings 112-114 could have other shapes and need not be circular. Also, the relative sizes and thicknesses of the various layers shown in FIG. 1B can vary as needed or desired. Further, as noted above, various characteristics of one or more stress compensation rings (such as the number of rings, the positions of the rings, and the dimensions of the rings) could vary in order to achieve a desired level of stress compensation. Moreover, if needed or desired, the stress compensation rings 112-114 could join each other and completely cover the piezoelectric capacitor 104. In addition, while each stress compensation ring 112-114 is shown here as forming a complete loop, each stress compensation ring 112-114 need not form a continuous structure.

Figure 2A:
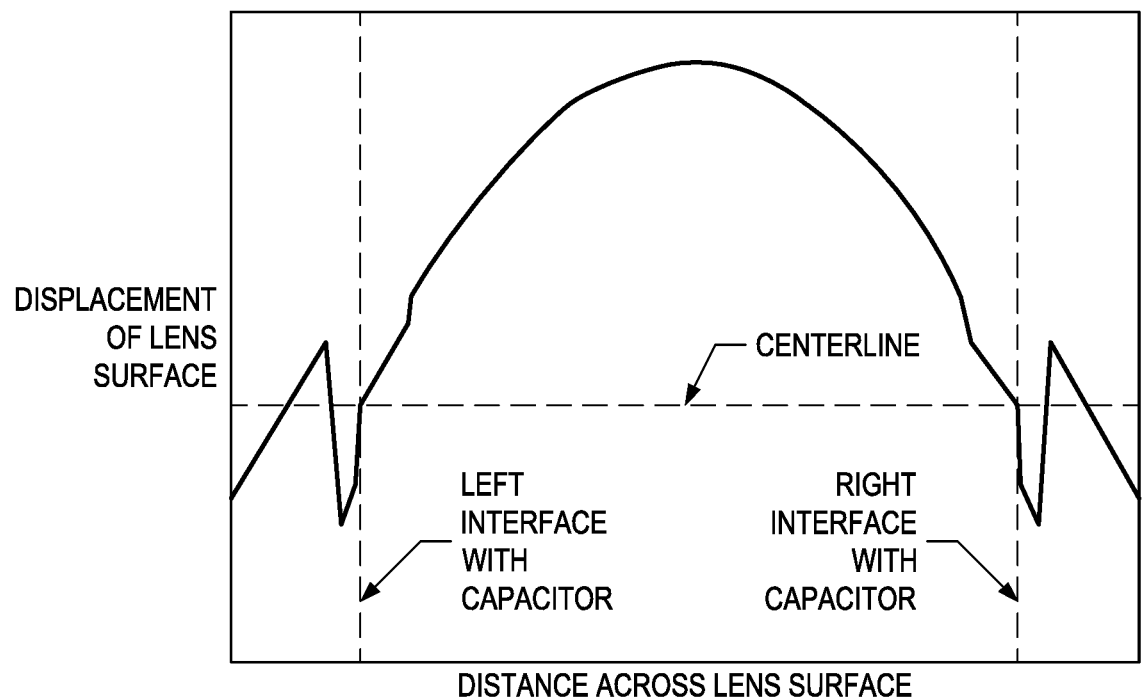
FIGS. 2A and 2B illustrate example shapes of a lens in a piezoelectric optical MEMS device without and with stress compensation in accordance with this disclosure.
Figure 2B:
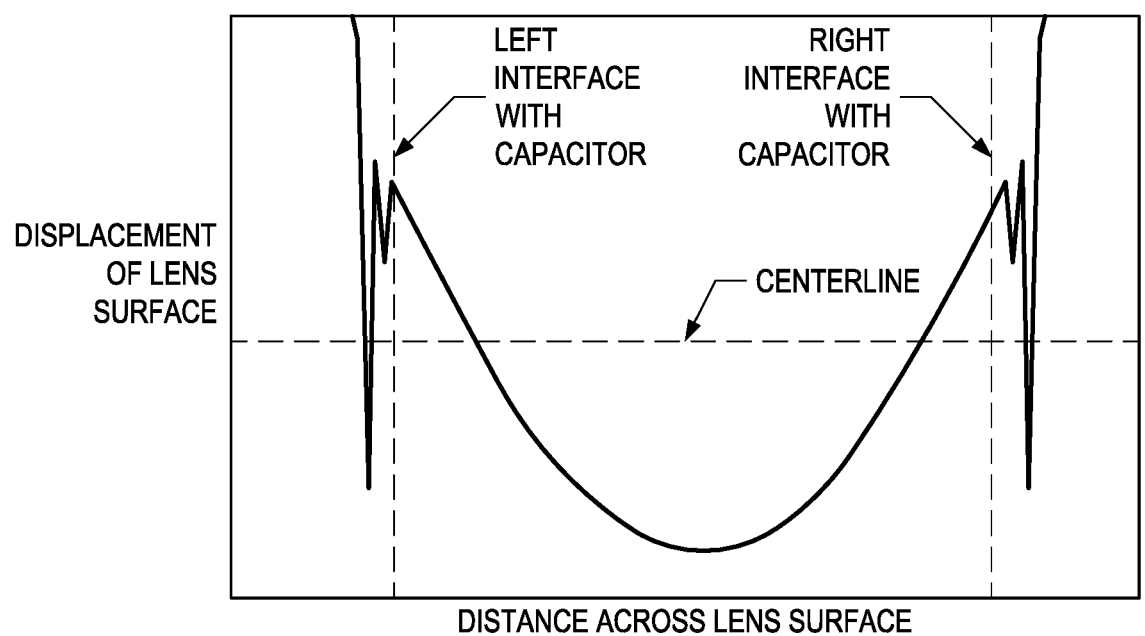

FIGS. 2A and 2B illustrate example shapes of a lens in a piezoelectric optical MEMS device without and with stress compensation in accordance with this disclosure. In particular, FIG. 2A illustrates an example shape of the lens material 102 when no stress compensation is provided, and FIG. 2B illustrates an example shape of the lens material 102 when stress compensation is provided using one or more stress compensation rings 112-114. In both cases, no voltage is currently being applied across the piezoelectric capacitor 104.

In each figure, distance when moving across the exposed portion of the lens material's top surface is represented on the horizontal axis, and displacement of the lens material's top surface from a centerline position (positive or negative) is represented on the vertical axis. The centerline position defines a completely planar top surface of the lens material 102 in FIG. 1B with no bending up or down. Two outer vertical lines in each figure denote interface locations where the lens material 102 starts being covered by the piezoelectric capacitor 104. Displacements shown outside these vertical lines can be ignored as they do not affect the optical characteristics of the lens material 102 within an aperture formed by the piezoelectric capacitor 104.

As shown in FIG. 2A, when the optical MEMS device lacks stress compensation, stresses created by the piezoelectric capacitor 104 could cause the lens material 102 to bulge upward even when no voltage is being applied across the piezoelectric capacitor 104. This is typically undesirable because it creates an offset in the lens material's position. This can be particularly problematic if the piezoelectric capacitor 104 can only cause the lens material 102 to move upward when a voltage is applied across the piezoelectric capacitor 104. Since the lens material 102 is already bulging upward, any voltage applied across the piezoelectric capacitor 104 may only cause the lens material 102 to bulge upward more. Since there is a limit to the amount of upward bulge that can be induced in the lens material 102, the upward bulge that exists when no voltage is applied across the piezoelectric capacitor 104 represents an offset that cannot be corrected. This offset clearly limits the amount of change that can be induced in the lens material 102, reducing the range of focus for the lens.

In contrast, as shown in FIG. 2B, when the optical MEMS device includes stress compensation, the lens material 102 may actually bulge downward when no voltage is being applied across the piezoelectric capacitor 104. Smaller voltages applied across the piezoelectric capacitor 104 may cause the lens material 102 to bulge downward less or become substantially planar. Larger voltages applied across the piezoelectric capacitor 104 may cause the lens material 102 to bulge upwards. Since the lens material 102 can move from a downward-bulging position to an upward-bulging position, the lens material 102 can provide a greater range of focus compared to the lens material 102 without stress compensation.

Note that while FIG. 2B shows the lens material 102 bulging downward, this is not required. In other embodiments, for example, stress compensation can be used so that the lens material 102 is substantially planar when no voltage is applied across the piezoelectric capacitor 104. In still other embodiments, stress compensation can be used so that the lens material 102 bulges slightly upwards (but to a lesser extent than in FIG. 2A) when no voltage is applied across the piezoelectric capacitor 104.

Although FIGS. 2A and 2B illustrate example shapes of a lens in a piezoelectric optical MEMS device without and with stress compensation, various changes may be made to FIGS. 2A and 2B. For example, the shapes of the lenses shown in FIGS. 2A and 2B are examples only. Other implementations of the piezoelectric optical MEMS device 100 without and with stress compensation could result in other shapes of the lens material 102.

Figure 3:
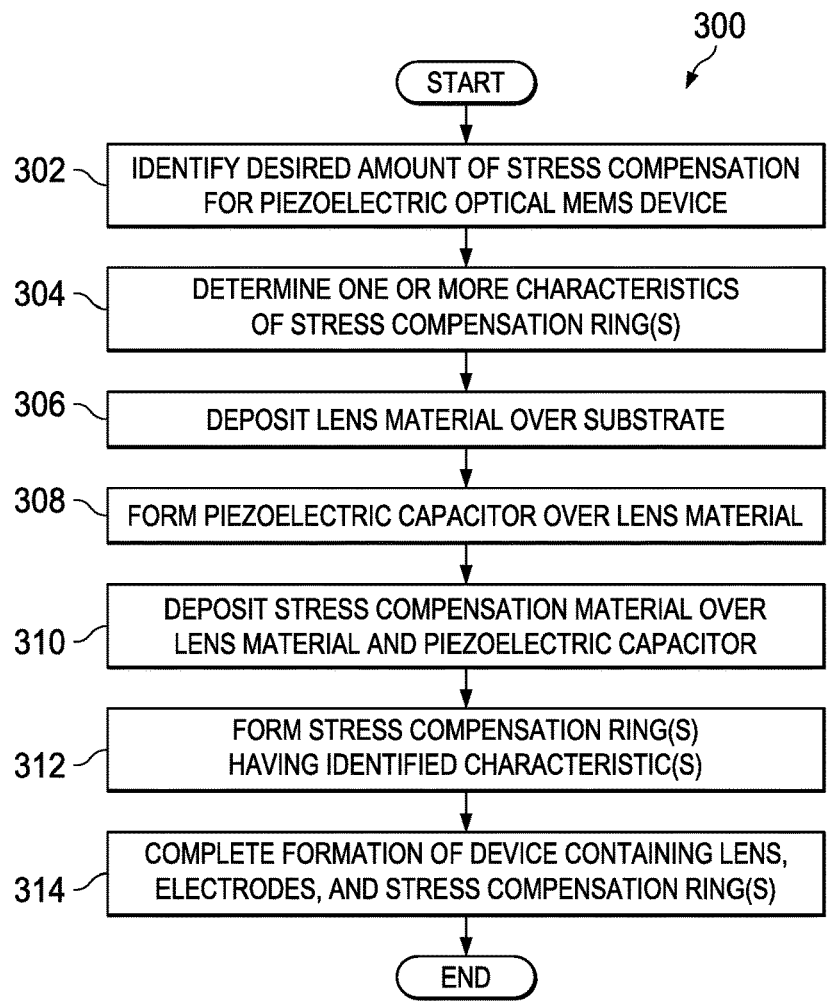
FIG. 3 illustrates an example method for providing stress compensation in a piezoelectric optical MEMS device in accordance with this disclosure.

FIG. 3 illustrates an example method 300 for providing stress compensation in a piezoelectric optical MEMS device in accordance with this disclosure. For ease of explanation, the method 300 is described with respect to the piezoelectric optical MEMS device 100 of FIGS. 1A and 1B. However, the method 300 could be used to provide stress compensation in any other suitable optical MEMS device.

As shown in FIG. 3, a desired amount of stress compensation for a piezoelectric optical MEMS device is identified at step 302, and one or more characteristics of one or more stress compensation rings are identified based on the desired amount of stress compensation at step 304. This could include, for example, running simulations on a proposed design for a piezoelectric optical MEMS device 100 to identify the amount of compression stress imparted to the lens material 102 by the piezoelectric capacitor 104 or other stresses on or in the lens material 102. Simulations can also be performed to identify a design of the stress compensation rings 112-114 that counteract the identified stresses. Other techniques could also be used, such as creating different piezoelectric optical MEMS devices 100 with stress compensation rings of differing characteristics.

Lens material is deposited over a substrate at step 306, and a piezoelectric capacitor is formed over the lens material at step 308. This could include, for example, depositing glass material (such as BPSG) or other lens material 102 over a silicon wafer or other substrate. This could also include depositing platinum or other metal(s) over the lens material 102 to form the electrodes 106-108. The piezoelectric material, such as a layer 110 of PZT, separates the electrodes 106-108 from one another and is formed between formation of the electrode 106 and formation of the electrode 108. Note that a seeding layer can be used to facilitate formation of the electrode 106 over the lens material 102.

Stress compensation material is deposited over the lens material and over the piezoelectric capacitor at step 310. This could include, for example, depositing one or more thin film layers or other layers of silicon nitride, titanium nitride, oxide, or other material(s) over the lens material 102 and over the piezoelectric capacitor 104. Any suitable deposition technique(s) could be used here. One or more stress compensation rings having the identified characteristic(s) are formed using the stress compensation material at step 312. This could include, for example, using a photolithography technique in which a layer of photoresist material is deposited over the stress compensation material and patterned to form a photomask. This could also include etching exposed portions of the stress compensation material so that remaining portions of the stress compensation material form the stress compensation rings 112-114.

Formation of the piezoelectric optical MEMS device is completed at step 314. This could include, for example, forming a protective oxide layer over the lens material 102, the piezoelectric capacitor 104, and the stress compensation rings 112-114. This could also include forming electrical contacts that are electrically coupled to the electrodes 106-108, forming bond pads, and electrically coupling the electrical contacts to the bond pads. This could further include performing backend processing to remove at least part of the silicon wafer or other substrate on which the lens material 102 was deposited, thereby forming a lens. Any other or additional operations could occur to complete the formation of the piezoelectric optical MEMS device.

Although FIG. 3 illustrates one example of a method 300 for providing stress compensation in a piezoelectric optical MEMS device, various changes may be made to FIG. 3. For example, while shown as a series of steps, various steps in FIG. 3 could overlap, occur in parallel, occur in a different order, or occur any number of times. Additional steps could also be added. For instance, prior to or after formation of the stress compensation rings 112-114, the structure can undergo an anneal in nitrogen gas prior to an anneal in oxygen gas, which can help to reduce or prevent discharge defects from forming and electrode delamination from occurring in the piezoelectric optical MEMS device 100.

Figure 4:
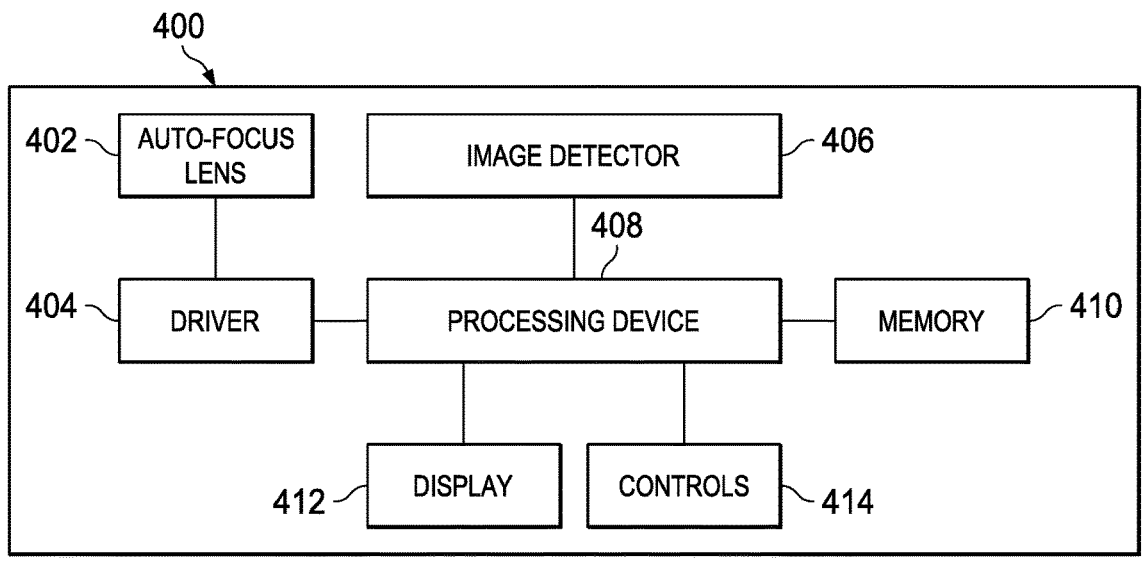
FIG. 4 illustrates an example device containing a piezoelectric optical MEMS device in accordance with this disclosure.

FIG. 4 illustrates an example device 400 containing a piezoelectric optical MEMS device in accordance with this disclosure. In this example, the device 400 includes an auto-focus lens 402, which could, for example, represent the piezoelectric optical MEMS device 100 of FIGS. 1A and 1B.

In FIG. 4, the auto-focus lens 402 is coupled to a driver 404. The driver 404 provides electrical signals to the auto-focus lens 402, thereby changing the focus of the auto-focus lens 402. For example, the driver 404 could provide a voltage across the electrodes 106-108 of the MEMS device. The voltage causes the piezoelectric layer 110 to change the shape of the lens material 102, altering the focus of the lens. The driver 404 includes any suitable structure for providing electrical signals (such as one or more voltages) to an auto-focus lens.

The device 400 also includes an image detector 406, at least one processing device 408, and at least one memory 410. The image detector 406 captures images obtained using light passing through the auto-focus lens 402. The image detector 406 represents any suitable structure for capturing images, such as a charge-coupled device (CCD), a complementary metal oxide semiconductor (CMOS) device, or a charge injection device (CID). In particular embodiments, the image detector 406 includes a two-dimensional array of detection elements, such as an array of monochrome or red-green-blue (RGB) detectors.

The processing device 408 performs various functions in the device 400, such as processing information from the image detector 406 to generate captured image files or controlling the driver 404 to alter the focus of the lens 402. The processing device 408 could perform any number of functions as needed or desired, such as functions typically associated with digital cameras or video recorders. Each processing device 408 includes any suitable processing or computing device, such as a microprocessor, microcontroller, digital signal processor (DSP), field programmable gate array (FPGA), application specific integrated circuit (ASIC), or discrete logic devices. The at least one memory 410 stores instructions and data used, generated, or collected by the device 400, such as captured images. Each memory 410 includes any suitable volatile or non-volatile storage and retrieval device, such as a random access memory (RAM) or a Flash or other read-only memory (ROM).

The device 400 also includes a display 412 and one or more controls 414. The display 412 can be used for various purposes, such as to allow a user to view captured images or prepare for new images to be captured. The display 412 could also present information to the user, such as information defining available or selected options or information describing captured images. If implemented as a touchscreen, the display 412 could further receive input from the user. The controls 414 can be used to trigger various functions (such as image captures), change various options of the device 400, and generally interact with the device 400. The display 412 includes any suitable structure for presenting images or information to a user, such as a liquid crystal display (LCD) or light emitting diode (LED) display. The controls 414 include any suitable structure(s) for receiving user input, such as one or more buttons, dials, or slides.

Although FIG. 4 illustrates one example of a device 400 containing a piezoelectric optical MEMS device, various changes may be made to FIG. 4. For example, while shown as being used as part of a camera or video recorder, the piezoelectric optical MEMS device 100 could be used with any other suitable device or system in which focusing of light using a lens is desired or required.

It may be advantageous to set forth definitions of certain words and phrases used throughout this patent document. Terms such as "over" or "under," when used with reference to components of a semiconductor device or integrated circuit, refer to relative positions of those components when viewed in particular orientations. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a lens formed from a lens material;
   a piezoelectric capacitor having a first electrode interfacing the lens material, and a second continuous ring-shaped electrode having a first surface facing away from the first electrode, the first electrode located between the second electrode and the lens material;
   a first ring-shaped stress compensation structure extending over the lens material and having a first segment that covers an outer circumferential perimeter of the second electrode and having a second segment that covers a first portion of the first surface that forms a first edge with the outer circumferential perimeter; and
   a second ring-shaped stress compensation structure extending over the lens material and having a third segment that covers an inner circumferential perimeter of the second electrode and having a second segment that covers a second portion of the first surface that forms a second edge with the inner circumferential perimeter,
   wherein the first surface of the second electrode includes a third portion that is separate from the first and second portions and is not covered by the first and second ring-shaped stress compensation structures.

2. The apparatus of claim 1, wherein the first and second ring-shaped stress compensation structures are each ring-shaped and are arranged concentrically with respect to one another.

3. The apparatus of claim 1, wherein the first and second ring-shaped stress compensation structures are not connected to each other.

4. The apparatus of claim 1, wherein:
the second electrode is ring-shaped; and
the third portion of the first surface of the second electrode is ring-shaped.

5. The apparatus of claim 1, wherein a surface of the lens material is substantially planar when no voltage is applied across the piezoelectric capacitor.

6. The apparatus of claim 1, wherein:
a surface of the lens material bulges downward when no voltage is applied across the piezoelectric capacitor; and
the piezoelectric capacitor is configured to cause the surface of the lens material to bulge upward in response to a voltage applied across the piezoelectric capacitor.

7. The apparatus of claim 1, comprising a piezoelectric material disposed between the first and second electrodes of the piezoelectric capacitor, wherein the piezoelectric material is configured to change shape in response to a voltage applied across the piezoelectric capacitor.

8. The apparatus of claim 7, wherein the first and second electrodes comprise at least one of platinum, nickel, or palladium, and the piezoelectric material comprises lead zirconium titanate (PZT).

9. The apparatus of claim 1, further comprising a piezoelectric material between the first and second electrodes, and wherein the first ring-shaped stress compensation structure covers sidewalls of the first and second electrodes and a sidewall of the piezoelectric material, the sidewall of the piezoelectric material being coplanar with the sidewalls of the first and second electrodes.

10. The apparatus of claim 1, wherein the first and second ring-shaped stress compensation structures touch the lens material.

11. A system comprising:
an auto-focus lens assembly comprising:
a lens formed from a lens material;
a piezoelectric capacitor having a first electrode interfacing the lens material, and a second electrode having a first surface facing away from the first electrode; and
a stress compensation structure comprising:
a first contiguous portion that extends over the lens material and covers an outer circumferential perimeter of the second electrode and a first portion of the first surface that forms a first edge with the outer circumferential perimeter, the first edge extending along the entire outer circumferential perimeter and being covered by the first contiguous portion; and
a second contiguous portion that extends over the lens material and covers an inner circumferential perimeter of the second electrode and a second portion of the first surface that forms a second edge with the inner circumferential perimeter, the second contiguous portion covering the entire second edge,
wherein the first and second contiguous portions of the stress compensation structure are disconnected from each other, and the second electrode is shaped as a ring, the first edge is an outer edge of the ring, and the second edge is an inner edge of the ring.

12. The system of claim 11, comprising a piezoelectric material disposed between the first and second electrodes of the piezoelectric capacitor, wherein the piezoelectric material is configured to change shape in response to a voltage applied across the piezoelectric capacitor.

13. The system of claim 12, wherein the piezoelectric capacitor causes a surface of the lens material to change shape in response to the voltage applied across the piezoelectric capacitor.

14. The system of claim 11, wherein:
the outer edge is substantially circular; and
the inner edge is substantially circular.

15. The system of claim 11, wherein the first and second contiguous portions of the stress compensation structure are disconnected from each other so that a third portion of the second electrode remains uncovered by the stress compensation structure.

16. The system of claim 11, wherein the first and second contiguous portions are each ring-shaped and are arranged concentrically with respect to one another with the first contiguous portion being around the second contiguous portion.

17. An apparatus comprising:
a lens formed from a lens material;
a piezoelectric capacitor having a first electrode interfacing the lens material, and a second electrode having a first surface facing away from the first electrode;
a first ring-shaped stress compensation structure extending over the lens material and covering an outer circumferential perimeter of the second electrode and a first portion of the first surface that forms a first edge with the outer circumferential perimeter; and
a second ring-shaped stress compensation structure extending over the lens material and covering an inner circumferential perimeter of the second electrode and a second portion of the first surface that forms a second edge with the inner circumferential perimeter,
wherein the first surface of the second electrode includes a third portion that is separate from the first and second portions and is not covered by the first and second ring-shaped stress compensation structures, and the first and second contiguous portions are each ring-shaped and are arranged concentrically with respect to one another with the first contiguous portion being around the second contiguous portion.

18. A system comprising:
an auto-focus lens assembly comprising:
a lens formed from a lens material;
a piezoelectric capacitor having a first electrode interfacing the lens material, and a second electrode having a first surface facing away from the first electrode; and
a stress compensation structure comprising:
a first contiguous portion that extends over the lens material and covers an outer circumferential perimeter of the second electrode and a first portion of the first surface that forms a first edge with the outer circumferential perimeter, the first edge extending along the entire outer circumferential perimeter and being covered by the first contiguous portion; and
a second contiguous portion that extends over the lens material and covers an inner circumferential perimeter of the second electrode and a second portion of the first surface that forms a second edge with the inner circumferential perimeter, the second contiguous portion covering the entire second edge, wherein the first and second contiguous portions of the stress compensation structure are disconnected from each other, and the first and second contiguous portions are each ring-shaped and are arranged concentrically with respect to one another with the first contiguous portion being around the second contiguous portion.

* * * * *